United States Patent [19]

Vig et al.

[11] Patent Number: 5,517,112
[45] Date of Patent: May 14, 1996

[54] MAGNETIC FIELD DETECTOR WITH NOISE BLANKING

[75] Inventors: Ravi Vig, Bow; Jacob K. Higgs, Concord, both of N.H.

[73] Assignee: Allegro Microsystems, Inc., Worcester, Mass.

[21] Appl. No.: 335,276

[22] Filed: Nov. 7, 1994

[51] Int. Cl.$^6$ .......................... G01R 33/07; H01H 36/00; H03K 17/95; H03K 5/1252
[52] U.S. Cl. .................. 324/251; 307/116; 324/207.12; 324/207.2; 327/205; 327/511; 327/551
[58] Field of Search .................. 324/117 H, 207.12, 324/207.2, 207.21, 207.25, 251, 252; 327/187, 205, 310, 511, 551; 307/116; 323/294, 368

[56] References Cited

U.S. PATENT DOCUMENTS

| | | | |
|---|---|---|---|
| 4,465,976 | 8/1984 | Avery et al. | 324/251 |
| 4,727,270 | 2/1988 | Payne | 324/207.12 X |

*Primary Examiner*—Gerard R. Strecker

[57] ABSTRACT

There is added to a conventional magnetic-field detector, which includes a magnetic-field-to-voltage transducer such as a Hall element connected to a Schmitt trigger circuit, a DC voltage monitor circuit to produce a high binary monitor signal only when the DC supply voltage is within a predetermined normal band, and a logic circuit having one input connected to the output of the monitor circuit and a second input connected to the output of the Schmitt trigger circuit. During periods when the binary-Schmitt-output voltage remains high, corresponding for example to a high ambient magnetic field, noise spikes on the DC line can cause an anomalous change in the binary-Schmitt-output voltage of a magnetic-field detector from a high level to a low level. The logic circuit is such that during an enabling period in which the output signal from the DC supply voltage monitor is continuously of the one type, the logic output produces a binary logic output-signal transition from a first binary level to the second binary level only following a transition in the Schmitt output signal from the high level to the low level, so that in the presence of noise spikes of either polarity that momentarily cause the DC supply voltage to exit the predetermined normal DC supply voltage band, the binary logic output signal essentially mirrors the Schmitt output signal with noise removed.

4 Claims, 6 Drawing Sheets

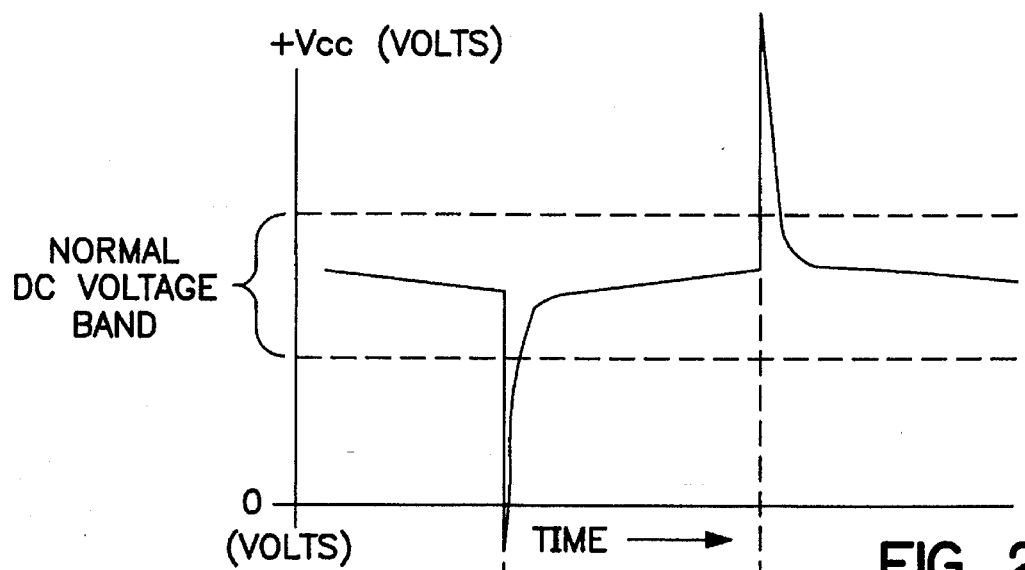
FIG. 2a
FIG. 2b
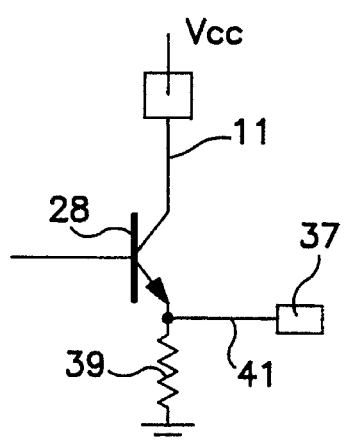
FIG. 3
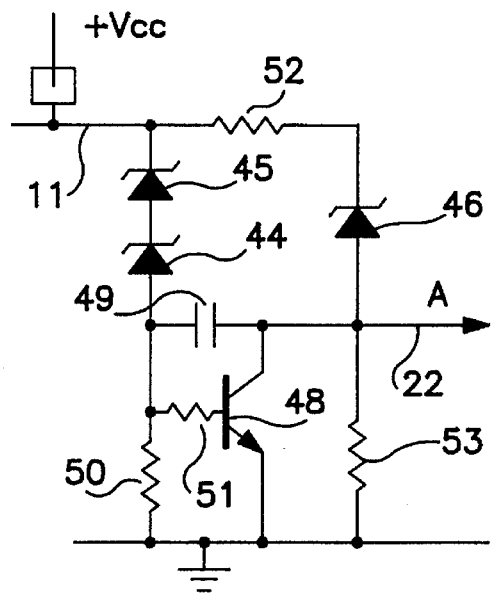
FIG. 4

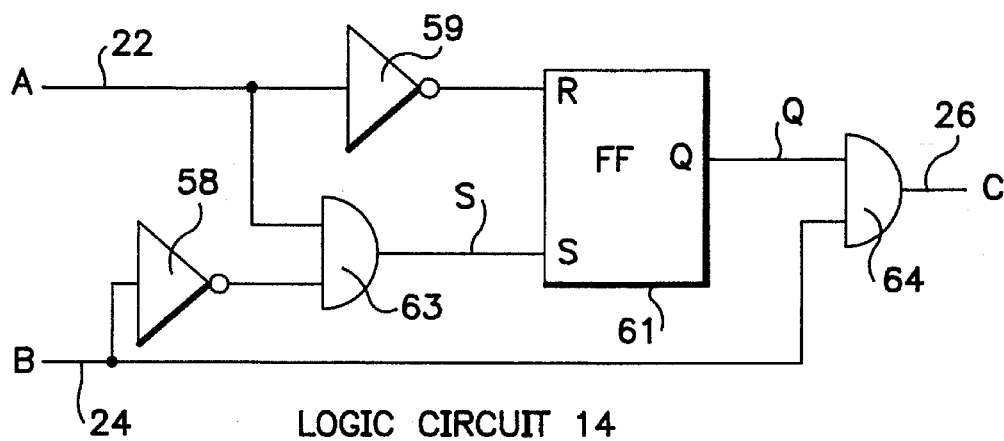
LOGIC CIRCUIT 14
FIG. 5
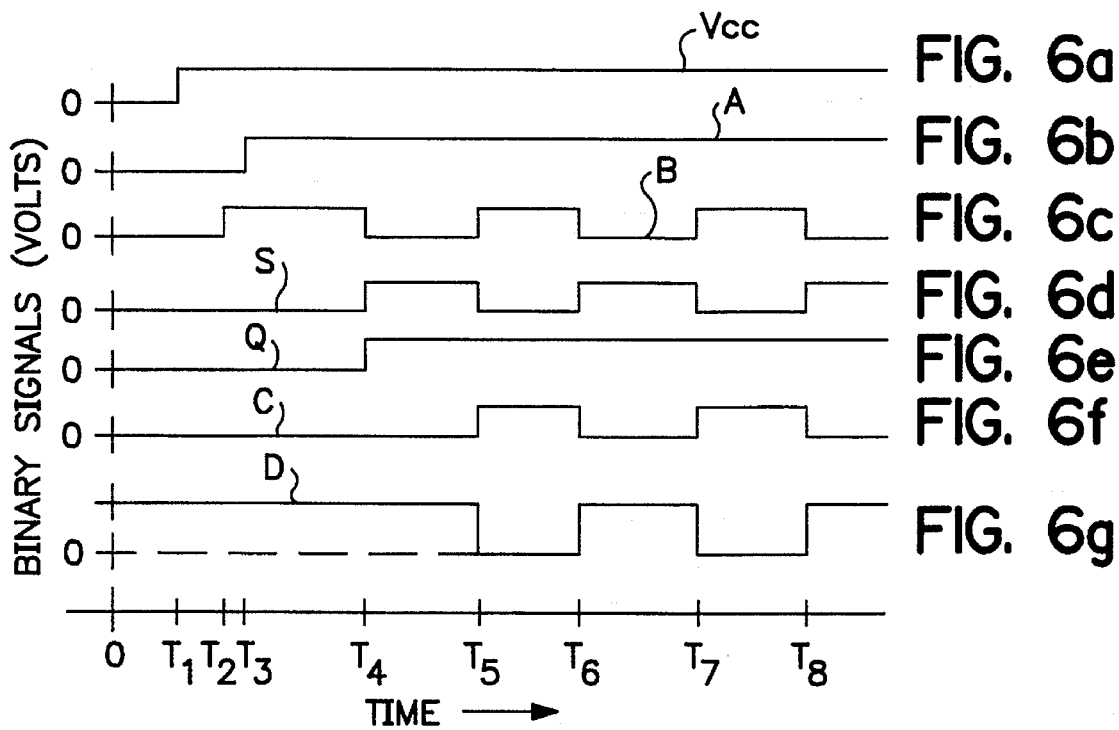
FIG. 6a
FIG. 6b
FIG. 6c
FIG. 6d
FIG. 6e
FIG. 6f
FIG. 6g

MAGNETIC FIELD DETECTOR WITH NOISE BLANKING

BACKGROUND

This invention relates to a proximity detector having a latching ferro-magnetic proximity detector including a Hall element, a Schmitt trigger circuit and a voltage regulator which may perform abnormally producing at the output of the Schmitt trigger circuit spurious binary signals during periods when either an over voltage or under voltage appears on the DC voltage supply line, and more particularly pertains to such a detector that includes a logic circuit for blanking and preventing anomalous binary signals or "noise" pulses from propagating through from the DC voltage supply line to the output of the magnetic field detector.

It is well known to make integrated circuit magnetic field sensors and proximity detectors that include a Hall element, serving as a magnetic-field-to voltage transducer, followed by a Schmitt trigger circuit. Various of such known sensors are described in the U.S. Pat. No. 4,374,333 to G. Avery; U.S. Pat. No. 4,443,716 to G. Avery; U.S. Pat. No. 4,518,918 to G. Avery; U.S. Pat. No. 4,705,964 to J. Higgs; U.S. Pat. No. 4,761,569 to J. Higgs; U.S. Pat. No 4,791,311 to R. Vig, D. Demingware and A. Tu; and U.S. Pat. No. 5,045,920 to R. Vig; these patents being assigned to the same assignee as is the present invention.

Typically the binary output signal of the Schmitt trigger circuit goes high when the ambient magnetic field from the South end of a magnet is rising and exceeds a predetermined polarity and magnitude, that predetermined magnitude, $B_{op}$, being established by the characteristic upper threshold of the Schmitt trigger circuit. Schmitt trigger circuits have hysteresis, so that subsequently, when the magnetic field falls to a magnitude, $B_{rp}$, established by the characteristic lower threshold of the Schmitt trigger circuit, the binary output voltage changes to a low value.

These magnetic-field detector circuits are usually formed in a silicon integrated circuit that may include a simple voltage regulator that provides a regulated source of DC voltage, $V_{REG}$, for energizing the Hall element and the Schmitt trigger circuit.

We have determined that in these prior art magnetic-field detector circuits, when a large negative noise spike appears on the DC voltage line that is connected to and energizes the voltage regulator, and at the same time an ambient south-pole magnetic field strength at the Hall element exceeds $B_{op}$, the regulated DC voltage drops and the output voltage of the Schmitt trigger circuit will momentarily change from a binary high to a binary low. In other words, an anomalous Schmitt circuit output pulse will be produced that is not a response to a change in magnetic field. Thus in response to a burst of negative noise pulses during a period when the field exceeds $B_{op}$, the detector will produce multiple false signals.

In such conventional detector circuits, negative noise pulses do not cause anomalous output signals during periods when there is a low south going ambient magnetic field and the resulting output of the Schmitt circuit is already low, because each large negative spike on the DC supply line to the regulator causes the output of the regulator to drop to near zero and produce a binary-low Schmitt-circuit-output signal. This binary-low level corresponds to the signal which already exists, being attributable to a low ambient magnetic field (less than $B_{op}$) at the Hall element.

Positive noise pulses likewise cause no anomalous output signals during periods when there is a low south going ambient magnetic field (less than $B_{op}$) and the output of the Schmitt circuit is therefore low for the same reason.

If the voltage regulator includes an over-voltage protection circuit whereby the regulator circuit is caused to shut down during the presence of a positive, i.e. an over-voltage noise spike, the regulated voltage itself, $V_{reg}$, momentarily drops to near zero in response to a such a positive noise spike. Such an over-voltage protection circuit is described in the patent to Higgs, Kawaji and Vig, U.S. Pat. No. 4,751,463 that is assigned to the same assignee as is the present invention.

Thus in such a detector, when either a large positive or negative noise spike appears on the DC voltage line during a period when the magnitude and polarity of the magnetic field are such that $B_{op}$ is exceeded, the regulated DC voltage rises and the output voltage of the Schmitt trigger circuit will have momentarily lost power and will momentarily change from a binary high to a binary low. In other words, an anomalous Schmitt circuit output pulse will be produced that is not a response to a change in magnetic field.

It follows that, in a conventional magnetic field detector with a regulator having an over-voltage protection circuit, the Schmitt circuit responds in the same way to both positive and negative noise (voltage out of range) on the Vcc line, for the condition that the noise occurs during a period when the magnetic field exceeds $B_{op}$. However, for the case when the magnetic field is less than $B_{rp}$, then the Schmitt circuit output signal is low or near zero and neither polarity of noise or out-of range DC supply voltage results in false outputs.

We have also noted that when the DC supply voltage from which a conventional magnetic-field detector is energized comes from a voltage regulator, that regulator and its output regulated supply voltage, Vreg, tend to perform erratically when the DC supply voltage, Vcc, from which the regulator is energized swings outside a predetermined voltage band; and the ultimate result tends to be the generation of false binary signals from the output of the magnetic-field detector, i.e. signals that are irregularly responsive to changes in the ambient magnetic field. Further the insertion of a voltage regulator between a source of DC supply voltage, Vcc, and the DC supply conductor of a conventional magnetic-field detector tends to exaggerate the deleterious effect on accurate performance of a magnetic-field detector of spurious noise spikes superimposed on the DC supply voltage, Vcc.

It is therefore an object of this invention to provide a magnetic field detector that essentially blanks DC-line noise pulses from feeding through to the detector output during periods when the ambient magnetic field is of a strength and polarity to render the binary output of the Schmitt trigger circuit high.

SUMMARY OF THE INVENTION

A magnetic field detector includes a magnetic-field-to-voltage transducer and a Schmitt trigger circuit having a Schmitt circuit output wherein the output of the transducer is connected to the input of the Schmitt trigger circuit. A DC voltage supply bus energizes the transducer and the Schmitt circuit. The Schmitt circuit produces at a Schmitt output a binary signal of a high voltage level when the ambient magnetic field lies within one predetermined range, e.g. a high south-polarity field range, and produces a binary signal of a low voltage level when the ambient magnetic field lies within another predetermined range e.g. a low south-polarity field range.

A DC supply voltage monitor, having a monitor output is connected to the supply bus for producing a binary monitor-output signal of one type, e.g. high, when the DC voltage on the bus lies within a predetermined normal band of voltages, and for producing a binary monitor-output signal of the other type, e.g. low, when the DC voltage on the bus lies outside the predetermined normal band.

A logic circuit has two inputs connected respectively to the Schmitt circuit output and to the monitor output, for during an enabling period in which the output signal from the DC supply voltage monitor is continuously of the one type, e.g. high, producing a binary logic output-signal transition from a first binary level, e.g. low, to the second binary level, e.g. high, only following a transition in the Schmitt output signal from the high level to the low level.

This magnetic-field detector is capable of producing a binary output signal that essentially mirrors the normal Schmitt output signal while blanking out any noise that may occur due to DC-supply over-voltage, DC-supply under-voltage, or DC-supply noise; or, in other words, this magnetic-field detector is capable of producing a binary output signal that essentially mirrors the Schmitt output signal which would have occurred if there had been no noise and the DC-supply voltage had remained within its normal band.

The logic circuit is preferably implemented by having a first invertor with an input connected to the monitor output, a second invertor with an input connected to the Schmitt output, a first AND gate with one input connected to the monitor output and another input connected to the output of the first invertor.

An R-S flip flop has a reset input connected to the output of the first invertor, and a set input connected to the output of the first AND gate. A second AND gate has one input connected to the output of the flip flop, and has another input connected to the Schmitt output.

It is also preferred that in the magnetic-field detector of this invention, the DC supply voltage monitor is connected interposed between the DC supply bus on the one hand and the transducer and Schmitt trigger circuit on the other hand. The monitor is thus combined with a voltage regulator for additionally providing a regulated DC voltage to the transducer and Schmitt circuit.

The method of this invention for detecting a magnetic field includes providing a conventional magnetic-field detector with magnetic-field-to-voltage transducer and a Schmitt trigger circuit wherein the transducer and Schmitt circuit are energized from a DC voltage supply bus. The Schmitt circuit output is a binary signal of a high voltage level when the ambient magnetic field lies within one predetermined range (e.g. a high field range), and is a binary signal of low voltage level when the ambient magnetic field lies within another predetermined range (e.g. a low field range).

The improvement over the conventional method entails generating a detector output pulse of one predetermined polarity only after each transition in the Schmitt circuit output signal from the high voltage level to the low level that occurs during a continuous enabling period in which the DC voltage on the DC voltage supply bus lies in a predetermined normal operating voltage band, so that in the presence of noise spikes of either polarity that momentarily cause the DC supply voltage to exit the predetermined normal DC supply voltage band, the detector output signal is composed of pulses that essentially mirror the Schmitt output signal with noise removed. This output signal may of course be the directly mirrored Schmitt signal or the inverted mirrored Schmitt signal.

BRIEF DESCRIPTION OF THE DRAWINGS

FIGS. 2a and 2b show, respectively, a waveform of the DC voltage. Vcc, that energizes the Hall element and Schmitt trigger circuit in the detector of FIG. 1, and a corresponding waveform A of the voltage monitor circuit in the detector of FIG 1.

FIG. 3 shows an alternate output stage for the detector of FIG. 1.

FIG. 4 shows a circuit diagram of the DC voltage monitor circuit in the detector of FIG. 1.

FIG. 5 shows a block diagram of the logic circuit in the detector of FIG. 1.

FIGS. 6a through 6g are drawn to the same time scale.

FIG. 6a shows a voltage wave form of the DC supply voltage Vcc for a period during and after turning on Vcc.

FIG. 6b shows a voltage waveform of the voltage A appearing at the output of the voltage monitor circuit of FIG. 1.

FIG. 6c shows a voltage waveform B appearing at the output of the Schmitt trigger circuit of FIG. 1.

FIG. 6d shows a voltage waveform S appearing at the set input of the flip flop in the logic circuit of FIG. 5.

FIG. 6e shows a voltage waveform Q appearing at the output of the flip flop in the logic circuit of FIG. 5.

FIG. 6f shows a voltage waveform C corresponding to the output of the logic circuit of FIG. 5.

FIG. 6g shows a voltage waveform of the detector output D which is logic-wise complementary to the waveform of FIG. 6f.

FIG. 8 shows a waveform of a magnetic field that is ambient to the Hall element in the block diagram of FIG. 7.

FIG. 9 shows a voltage waveform of the DC supply voltage Vcc that energizes the detector of FIG. 7.

FIG. 10 shows a voltage waveform of the Schmitt trigger circuit output B in the detector of FIG. 7, at which B output noise blanking is not effected.

FIG. 11 shows a voltage waveform of the logic circuit output C in the detector of FIG. 7, at which output C noise blanking is effected.

DESCRIPTION OF THE PREFERRED EMBODIMENT

Figure 1:
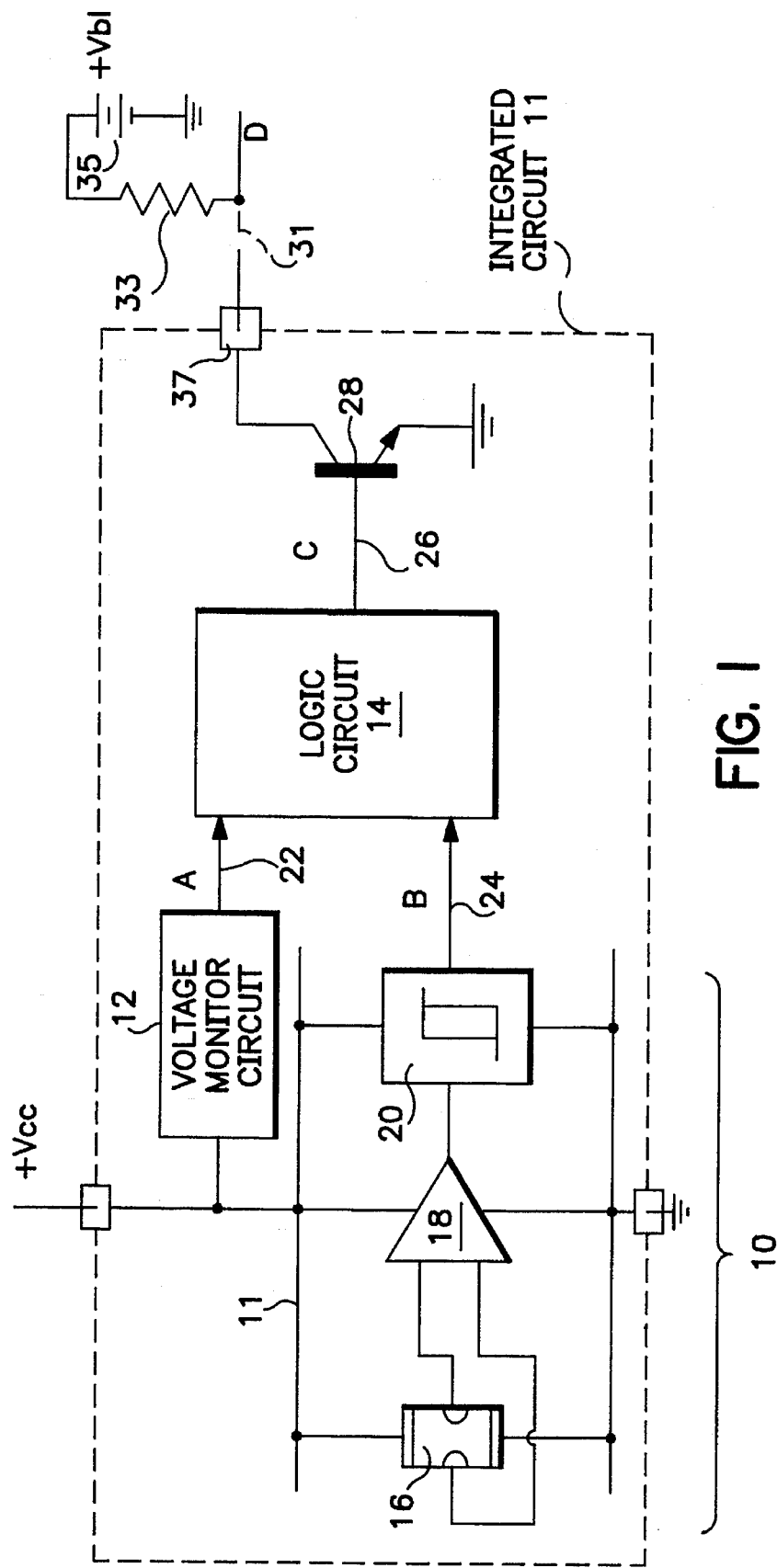
FIG. 1 shows a block diagram of a first embodiment of a magnetic field detector of this invention of this invention.

The magnetic field detector of FIG. 1 employs a conventional detector 10 to which has been added a voltage monitor 12 circuit and a logic circuit 14, all being energized from the DC voltage supply bus 11. The conventional detector 10 includes a Hall element 16, a Hall voltage amplifier 18 and a Schmitt trigger circuit 20, and the above-noted patent U.S. Pat. No. 4,705,964 describes in more detail such a conventional magnetic-field detector.

Referring to the voltage waveforms of FIG. 2a and 2b, the monitor circuit 12 produces a binary monitor-output signal M that is for example at a binary high voltage when the DC voltage is within a predetermined normal voltage range, and is at a binary low voltage when the DC voltage Vcc lies outside the predetermined normal voltage range, or band. The output of the detector may be taken as the output of the logic circuit 14, namely the binary signal C at conductor 26. When an output transistor 28 is added at the output of the logic circuit 14, as in FIG. 1, and the collector of transistor 28 is connected—usually via a long conductor 31—to a collector-load resistor 33 and thence to a separate positive DC voltage source 35, then the detector output signal at the integrated circuit contact pad 37 will be inverted as shown in the wave form D of FIG. 6g. In this case the output signal D from the integrated circuit detector 11 at contact pad 37 is a binary low signal when the ambient magnetic field is of a polarity and magnitude that exceeds $B_{op}$. In general, the output signals C and D mirror signal B when there is no noise.

Alternatively, the output transistor 28 may be connected as a voltage follower as shown in FIG. 3. The collector of transistor 28 in this case is preferably connected to Vcc. The output of this buffer stage is taken across an emitter resistor 39 at conductor 41 which is tied to the pad 37, the output of the detector. The binary output signal of the detector is now the same polarity binary signal as is signal B at the output of the Schmitt circuit 24.

The noise blanking magnetic-field detector circuit of FIG. 1 does not itself include a voltage regulator circuit and includes a simple DC supply voltage monitor circuit 12 that produces a binary low output signal when ever the DC supply voltage, labeled here Vcc, strays outside a predetermined voltage band as illustrated in FIG. 2a. However, the DC supply voltage Vcc in FIG. 1 may be obtained from the output of a voltage regulator circuit (not shown) lying outside the integrated circuit detector 11.

Referring to FIG. 4, the simple voltage monitor circuit 12 includes three zener diodes, 44, 45 and 46, a transistor 48 with a small collector-to-base capacitor 49, four resistors 50, 51, 52 and 53. Assuming that the breakdown voltage of the zener diodes 44, 45 and 46 are each eight volts, and that Vcc is nominally 12 volts, the binary output signal voltage A of the monitor 12 at conductor 22 is low when Vcc is greater than about 16 volts, is low when Vcc is less than about 8 volts and is only high when Vcc is within the band of about 8 to 16 volts.

Referring to FIG. 5, the logic circuit 14 has a monitor-signal input conductor 22, a Schmitt-circuit-signal input conductor 24, and a logic-signal output conductor 26 which may serve as the output of the magnetic field detector of FIG. 1. Logic circuit 14 includes two invertors 58 and 59, an R-S flip flop 61 and two AND gates 63 and 64.

The waveforms of FIGS. 6a through 6g represent the situation wherein the detector of FIG. 1 is being turned on, namely the situation wherein Vcc is being turned on. From the time of turn on, $\tau_1$, there is a slight delay of a few microseconds until time $\tau_3$ in the monitor output signal A, at which time Schmitt output signal B has just gone high, the magnetic field having just increased in the south polarity and exceeded $B_{op}$ at $\tau_1$. Meanwhile the detector output signal C at conductor 26 remains low and unchanged.

The logic circuit 14 insures that the detector output signal C does not go high for the first time after turn-on time $\tau_1$ until after the first occurrence of the Schmitt output signal B having gone from a high binary level to a low binary level, e.g. whereupon the flip flop 61 is set for the first time $\tau_4$, so that upon the next occurrence of the Schmitt signal B going from a low level to a high level the AND gate 64 also permits the logic output signal C to go from a low level to a high level for the first time at $\tau_5$.

The monitor circuit 12 together with the logic circuit 14 are therefore seen to prevent DC line noise from propagating through to the detector output during a period after turn-on of the detector. During turn-on of the detector, noise generated by switching on of the DC supply voltage, Vcc, is often present during this period in prior art detectors and typically produces false signals at the detector output.

Figure 7:
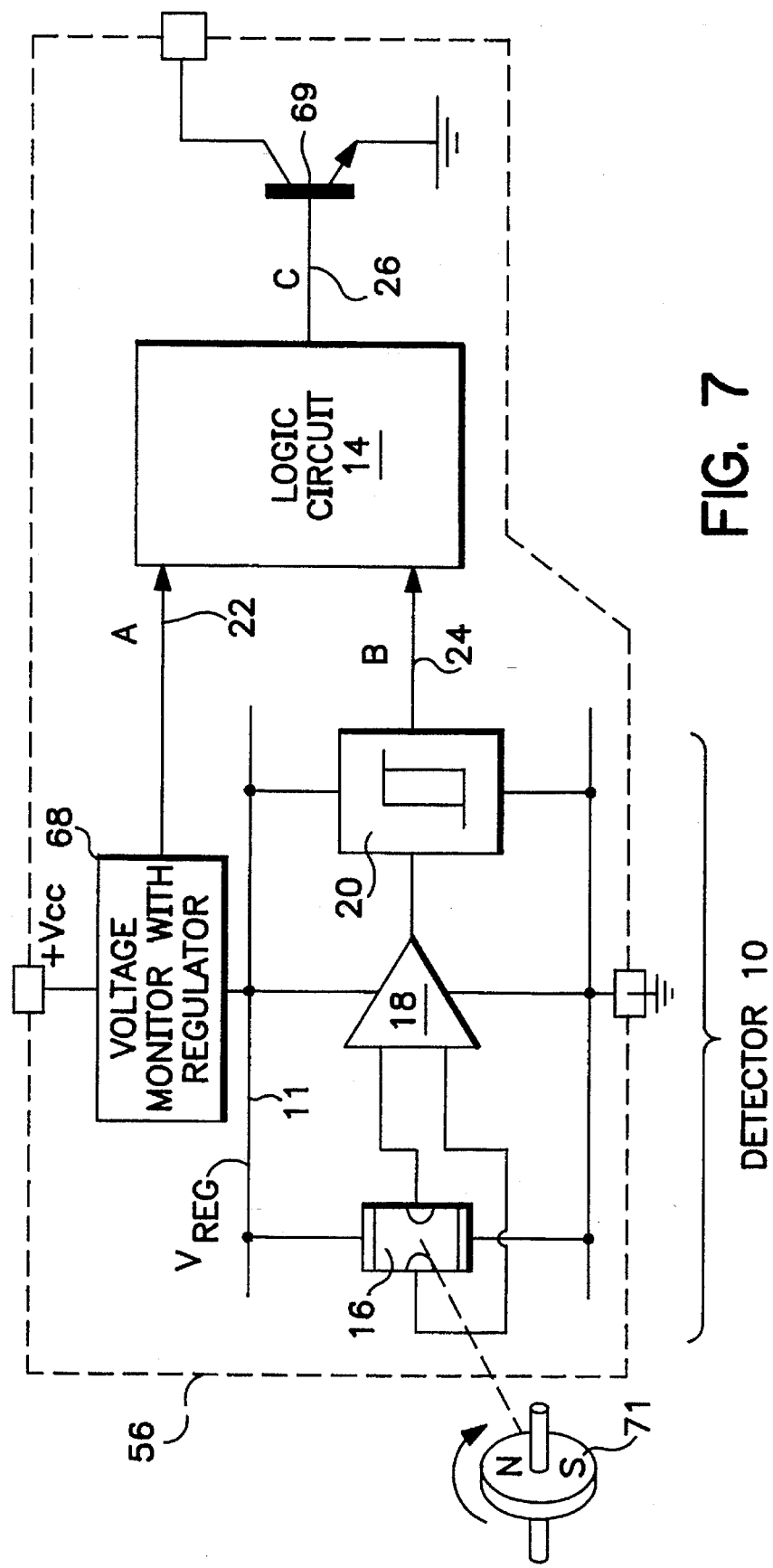
FIG. 7 shows a block diagram of a second preferred embodiment of a magnetic field detector of this invention.

An integrated-circuit magnetic field detector 56 of FIG. 7 employs a conventional detector 10 in which there is included a combined voltage-regulator and monitor circuit 68. It includes the logic circuit 14 and the conventional detector 10 made up of Hall element 16, Hall voltage amplifier 18 and Schmitt trigger circuit 20. Detector 56 may have a signal-inverting output transistor 69 as shown, but in the following discussion the output of detector 56 is considered to be coincident with the output of the logic circuit 14 at conductor 26.

A rotating magnet 71 mounted adjacent the Hall element 16 causes a varying magnetic field ambient to the Hall element 16 (in a similar manner to that shown in the thirteenth figure in the above-noted patent U.S. Pat. No. 4,443,716), which field is represented by the waveform in FIG. 8. In this construction, the magnetic field detector may be used as a speedometer by electronically determining the rate of passage of the positive or negative pulses in the binary output signal of the detector to measure the velocity of a rotating member, such as a wheel or drive shaft of an automobile (not shown), to which the magnet may be attached.

Alternatively, a magnet may be fixedly mounted to the detector package and an adjacent rotating ferro-magnetic (e.g. iron) toothed gear generates an undulating magnetic field ambient to the Hall element as is illustrated in the above-noted patent U.S. Pat. No. 4,518,918, providing a structure that is also capable of use as a speedometer. Similarly an odometer, or other displacement measuring instrument, may be had by simply counting the pulses at the binary output of the detector.

The detector 56 of FIG. 7, employing the same logic circuit 14, performs just as does the detector of FIG. 1, namely the simultaneous waveforms in FIGS. 4a through 4f apply as well to the detector 56 of FIG. 7, although the detector 56 has a combined voltage-regulator and monitor circuit 68.

Figure 8:
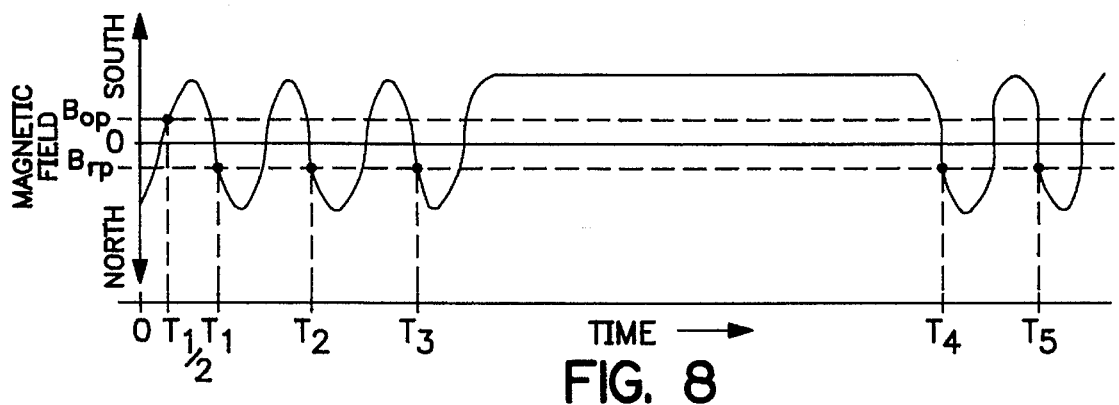
FIG. 8 through 11 are drawn to the same time scale.
Figure 10:
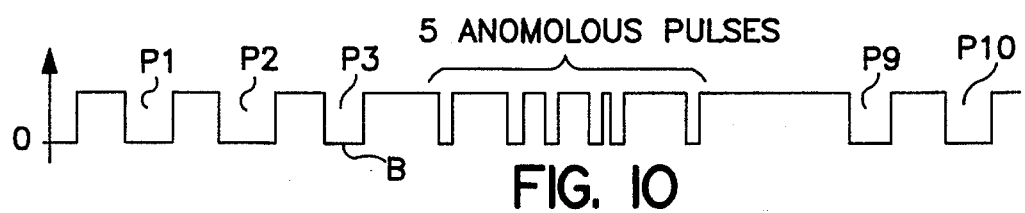
Figure 11:
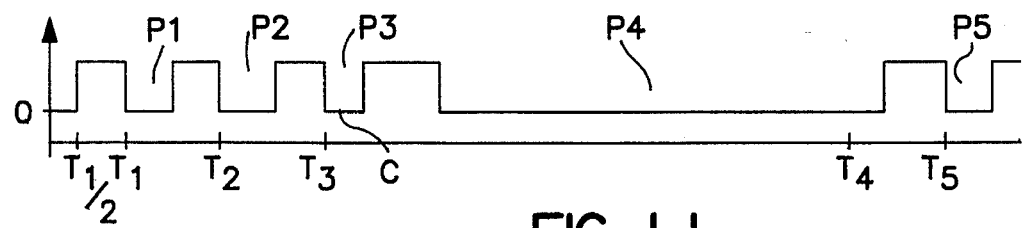

Referring to FIG. 8, when the ambient magnetic field rises from a north-polarity field up to the south-polarity field of magnitude $B_{op}$, the Schmitt trigger circuit operate point, the output signal B at conductor 24 of the Schmitt trigger circuit 20 changes (at time $\tau_1/2$) from a low binary voltage level to a high binary voltage level as shown in FIGS. 10 and 11. As the field subsequently moves downward and north again it reaches the field magnitude Brp (at time $\tau_1$) which corresponds to the Schmitt trigger circuit release point, $B_{rp}$ whereupon the Schmitt output signal B changes to a binary low voltage.

The waveforms of FIGS. 8 through 11 are for the condition that the DC supply voltage Vreg remains within its predetermined normal band, and consequently the monitor output signal A remains low.

Figure 9:
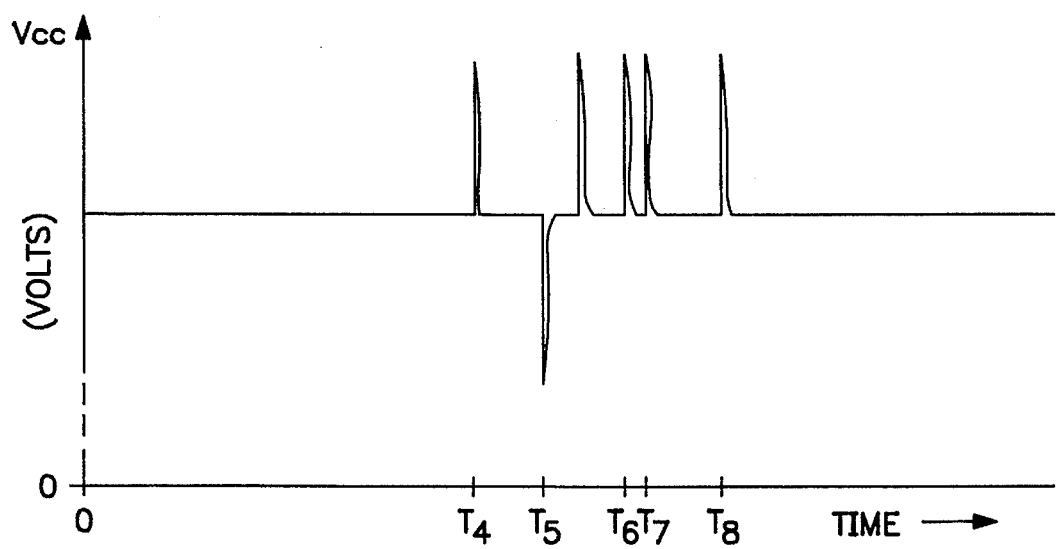

The magnetic-field waveform of FIG. 8 includes a long period in which the field remains at a magnitude of south-polarity exceeding $B_{op}$. This long period indicates that the magnet 71 of FIG. 7 has stopped rotating, which in the situation wherein the detector 56 is being used as a vehicle speedometer further indicates that the vehicle has stopped. DC line noise pulses of either voltage polarity, as shown in FIG. 9, which occur during such a period in which the magnetic field exceeds $B_{op}$, appear as shown in FIG. 10 as negative pulses at the output signal B of the Schmitt circuit at conductor 24.

However, these noise pulses are blocked from appearing in the detector output signal C at conductor 26 as is shown in FIG. 11.

It can be seen in FIG. 11 that the first noise pulse to occur after the stopping of rotation of magnet 71 a superfluous output pulse P4 is generated. But as was seen in the wave form of the detector output signal C in FIG. 6f, a pulse was lost at starting, so that the pulse count corresponds correctly to the distance the vehicle traveled from starting to stopping. Thus this noise blanking method does not impair the accuracy of the detector either as a speedometer or as an odometer.

The detector of this invention including a combined monitor and regulator 68 and an inverting output transistor 69 as is illustrated in FIG. 7, has a special advantage over the prior art magnetic-field detector to which is added an inverting output transistor as is illustrated in the above-noted patent U.S. Pat. No. 4,443,716 (in the first figure therein).

When the regulator of the prior art shuts down, e.g. in response to an under-voltage noise spike, the output of the Schmitt trigger circuit goes low, i.e. to near zero volts, and the output voltage at the collector of the inverting output transistor, that is connected to a separate DC voltage source, goes high regardless of the condition of the ambient magnetic field and produces a false output signal. However, in just such a situation, the magnetic-field detector of this invention does not give a false signal.

Although the particular circuits of FIGS. 1 and 7 produce a high binary signal at the Schmitt-circuit output when a magnetic field of south-polarity exceeds the Schmitt threshold, the scope of this invention is meant to also include detector circuits wherein a binary high Schmitt-circuit output voltage will result from a north-polarity magnetic field.

Figure 12:
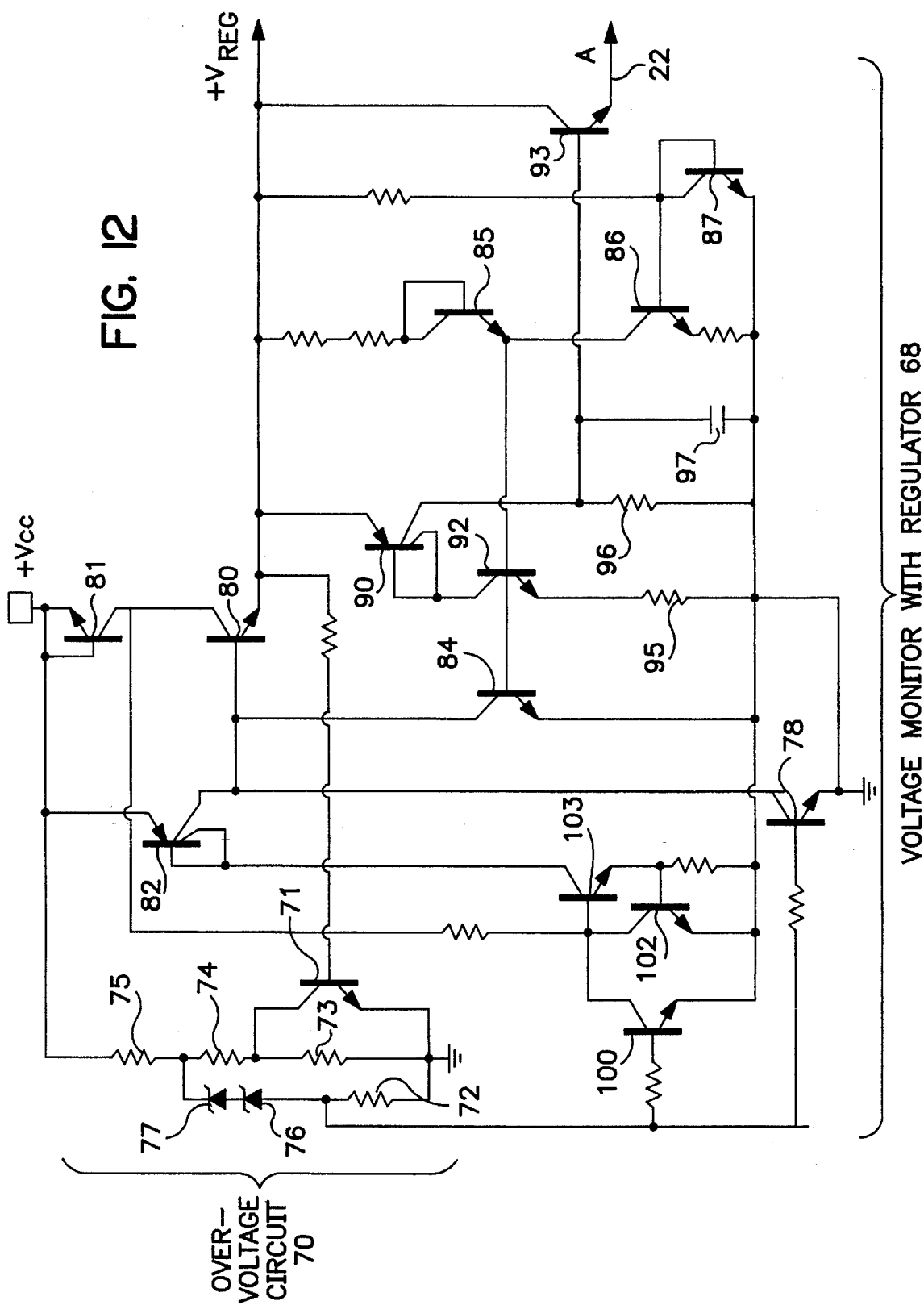
FIG. 12 shows a circuit diagram of the combined monitor and voltage-regulator circuit in the magnetic-field detector of FIG 7.

The combined monitor and voltage regulator circuit 68 provided in FIG. 12 incldues an over-voltage protection circuit 70 having transistors 71 and 78, four resistors 72, 73, 74 and 75, and a pair of zener diodes 76 and 77.

The voltage regulator portion of the circuit 68 includes the pass transistor 80, the zener diode connected transistor 81, and the other regulator transistors 82, 84, 85, 86 and 87. Another portion of the monitor/regulator circuit 68 is for providing a binary logic signal A that is high when Vreg is within a normal voltage band and is low when Vreg is outside that band; this binary output generating circuit portion includes transistors 90, 92 and 93 as well as the two resistors 95 and 96 and a fifteen picofarads capacitor 97 to provide a small delay between the turning on of binary monitor signal A after Vreg turns on.

The over-voltage circuit 70 senses the DC supply voltage Vcc and when it exits a normal supply voltage band due to noise or any other cause, turns off the transistor 78 that in turn clamps the base of the pass transistor 80 to ground and turns it off causing Vreg to drop to near zero volts. In conjunction with the over-voltage protection circuit 70, transistors 100, 102 and 103 disconnect the base of transistor 82 and protect that transistor also from breaking down during an excessively high line voltage, Vcc.

We claim:

1. A magnetic field detector of the kind including a magnetic-field-to-voltage transducer and a Schmitt trigger circuit having a Schmitt circuit output wherein the output of the transducer is connected to the input of the Schmitt trigger circuit, and a DC voltage supply bus being connected to said transducer and to said Schmitt circuit from which bus said transducer and Schmitt circuit may be energized, for producing at said Schmitt circuit output a binary signal of a high voltage level when the ambient magnetic field lies within one predetermined range, producing a binary signal of a low voltage level when the ambient magnetic field lies within another predetermined range, wherein the improvement comprises:

a DC supply voltage monitor, having a monitor output, and being connected to said supply bus for producing a binary monitor-output signal of one type when the DC voltage on said bus lies within a predetermined normal band of voltages, and for producing a binary monitor-output signal of the other type when the DC voltage on said bus lies outside the predetermined normal band; and a logic circuit having a logic output, and having two inputs connected respectively to said Schmitt circuit output and to said monitor output, for during an enabling period in which the output signal from said DC supply voltage monitor is continuously of the one type, producing a binary logic output-signal transition from a first binary level to the second binary level only following a transition in the Schmitt output signal from the high level to the low level, so that in the presence of noise spikes of either polarity that momentarily cause the DC supply voltage to exit the predetermined normal DC supply voltage band, the binary logic output signal essentially mirrors the Schmitt output signal with noise removed.

2. A magnetic field detector comprising a) a magnetic-field-to-voltage transducer having an output;

b) a Schmitt trigger circuit having a Schmitt output wherein the output of said transducer is connected to the input of said Schmitt trigger circuit;

c) a DC voltage supply bus being connected to said transducer and to said Schmitt circuit from which bus said transducer and Schmitt circuit may be energized;

d) a DC supply voltage monitor having a monitor output and being connected to said supply bus for producing a binary monitor-output signal of one type when the DC voltage on said bus lies within a predetermined normal band of voltages, and for producing a binary monitor-output signal of the other type when the DC voltage on said bus lies outside the predetermined normal band; and e) a logic circuit having a logic output, said logic circuit being further comprised of the binary logic circuits:
   1) a first invertor, having an input connected to said monitor output;
   2) a second invertor, having an input connected to said Schmitt output;
   3) a first AND gate having one input connected to said monitor output, and having another input connected to the output of said first invertor;
   4) an R-S flip flop having a reset input connected to the output of said first invertor, having a set input connected to the output of said first AND gate; and
   5) a second AND gate having one input connected to the output of said flip flop, and having another input connected to said Schmitt output.

3. The magnetic-field detector of claim 2 wherein said DC supply voltage monitor is connected interposed between said DC supply bus on the one hand and said transducer and Schmitt trigger circuit on the other hand, said monitor being additionally for providing a regulated DC voltage to said transducer and Schmitt circuit.

4. A method for detecting a magnetic field of the kind including providing a magnetic-field-to-voltage transducer having an output connected to the input of a Schmitt trigger circuit which produces at its output a binary output signal, wherein said transducer and said Schmitt trigger circuit are connected to a source of DC energizing voltage, wherein the improvement comprises:

monitoring the DC voltage from said source of DC energizing voltage;

generating a binary supply-voltage-related signal having one level when said DC voltage lies within a normal DC supply voltage band and having another level when the DC voltage lies outside said normal DC supply voltage band;

monitoring the generated binary supply-voltage-related signal and the Schmitt trigger circuit binary output signal; and generating a magnetic-field-related binary output signal that, in the presence of noise spikes of either polarity that momentarily cause the monitored DC supply voltage to exit said normal DC supply voltage band, essentially only mirrors the Schmitt trigger circuit binary output signal and does not contain binary transitions attributable to the momentary excursions of said monitored DC supply voltage outside said normal voltage band.

* * * * *